United States Patent [19]

Oki et al.

[11] 4,395,777
[45] Jul. 26, 1983

[54] DOUBLE SUPERHETERODYNE RECEIVER

[75] Inventors: Ryuji Oki; Takashi Ebisawa, both of Tokyo, Japan

[73] Assignee: Sony Corporation, Tokyo, Japan

[21] Appl. No.: 223,319

[22] Filed: Jan. 8, 1981

[30] Foreign Application Priority Data

Jan. 12, 1980 [JP] Japan .................................... 55-2297
Jan. 18, 1980 [JP] Japan ................................ 55-4435[U]

[51] Int. Cl.³ ............................................. H04B 1/26
[52] U.S. Cl. .................................. 455/183; 455/165; 455/185; 455/316
[58] Field of Search ................................ 455/314–316, 455/76, 165, 183, 185, 186; 331/18, 30

[56] References Cited

U.S. PATENT DOCUMENTS

| 3,327,222 | 6/1967 | King, Jr. | 455/315 |
| 3,696,422 | 10/1972 | Burrell | 455/76 |
| 3,962,644 | 6/1976 | Baker | 455/186 |

FOREIGN PATENT DOCUMENTS 55-53929 4/1980 Japan .................................... 455/36

OTHER PUBLICATIONS

Synthesized Communications Receiver–Wireless World–Dec. 1977, p. 86, vol. 83, No. 1504.
The MP: The Key to an Advanced Frequency Synthesized HF SSB Amateur Radio Transceiver–Robert M. Groh–Aug. 1980–IEEE Trans. on Consumer Electronics, vol. CE-26, pp. 234–246.

*Primary Examiner*—Marc E. Bookbinder
*Attorney, Agent, or Firm*—Lewis H. Eslinger; Alvin Sinderbrand

[57] ABSTRACT

A double superheterodyne receiver has a frontend stage for receiving an RF signal, a first phase-locked loop (PLL) local oscillator circuit for generating a first local oscillator signal, a first mixer for mixing the RF signal with the first local oscillator signal to produce a first IF signal, a second PLL local oscillator circuit for generating a second local oscillator signal, a second mixer for mixing the first IF signal with the second local oscillator signal to produce a second IF signal, a detector for detecting information carried on the second IF signal and control circuitry for controlling the dividing ratios of programmable frequency dividers respectively included in the first and second PLL local oscillator circuits. To tune the receiver to a desired RF frequency, the control circuitry, which can include a micro-computer, selects the dividing ratio $N_1$ of the first PLL local oscillator circuit and the dividing ratio $N_2$ of the second PLL local oscillator circuit according to a predetermined scheme. The RF frequency to which the receiver is tuned is determined by the first and second local oscillator signal frequencies. In one version thereof, the second local oscillator circuit includes a frequency converter and a selectively tunable reference oscillator, so that the second local oscillator signal can be accurately tuned for receiving SSB signals.

13 Claims, 3 Drawing Figures

FIG. 2

$fr = N_1 \times 100 - N_2 \times 1 - 66001 \text{ (kHz)}$

| $N_1$ | $N_2$ | $fr$ (kHz) |
|---|---|---|
| 665 | 399 | 100 |
| 665 | 398 | 101 |
| ¦ | ¦ | ¦ |
| 665 | 300 | 199 |
| 666 | 399 | 200 |
| 666 | 398 | 201 |
| ¦ | ¦ | ¦ |
| 666 | 300 | 299 |
| 667 | 399 | 300 |
| ¦ | ¦ | ¦ |
| 962 | 300 | 29899 |
| 963 | 399 | 29900 |
| 963 | 398 | 29901 |
| ¦ | ¦ | ¦ |
| 963 | 300 | 29999 |

DOUBLE SUPERHETERODYNE RECEIVER

BACKGROUND OF THE INVENTION

1. Field of the Invention

This invention relates to a double superheterodyne receiver, and particularly relates to such a receiver in which the first and second local oscillator circuits thereof are formed as phase-locked loop circuits.

2. Description of the Prior Art

Double superheterodyne receivers, which are also variously known as double-conversion receivers or triple-detector receivers, are commonly used in, for example, UHF communications. Such receivers provide high gain without instability, good suppression of image frequencies, and high-adjacent channel selectivity.

In these receivers, an incoming RF carrier frequency is mixed with a first local oscillator signal to produce a first IF signal, the latter is mixed with a second local oscillator signal to provide a second, or final IF signal, and such signal is provided to a detector to detect the information carried on the second IF carrier.

Various arrangements of double superheterodyne receivers have been proposed for receiving several AM frequency bands including, for example, a low-frequency or long-wave band, a broadcast frequency or medium-wave band, and several high-frequency or short-wave bands. The short-wave bands normally include a plurality of discrete bands, for example, a twenty-meter band, a sixteen-meter band, and a ten-meter band. Such a receiver is designed to attempt to receive as many frequencies as possible between about 100 KHz and several dozens of MHz.

In the previously proposed double superheterodyne receiver, a first main tuning dial is used to control the first local oscillator for coarse tuning, while a second or auxiliry tuning dial is provided for fine tuning to a specific frequency. The main tuning dial and the auxiliary dial each have a respective dial display. The dial display for the main tuning dial is usually divided into long-wave, medium-wave, and several short-wave portions, while the dial display for the auxiliary tuning dial has divisions corresponding to small frequency differences, for example, divisions of 1 KHz.

The receiver is tuned by rotating a main tuning knob until a pointer on the main tuning dial display is roughly aligned wth indicia indicating the approximate frequency desired. Then, a knob on the auxiliary tuning dial is adjusted until a fine-tuning indicator registers that the receiver has been tuned the desired frequency.

While such previously proposed double superheterodyne receivers can tune accurately to a desired frequency, they are rather bulky and are somewhat cumbersome to operate.

With a previously proposed receiver, it is necessary to adjust both the main tuning dial and the auxiliary tuning dial to establish the received frequency every time a new frequency is selected.

Furthermore, because each of the tuning knobs must have a dial display associated with it, the dial display requires a rather large area in the radio receiver and makes it difficult to construct the receiver as a compact unit.

Additionally, for receiving single side-band (SSB) transmissions on a previously proposed double super-heterodyne receiver, it is necessary to provide a change-over switch to set the receiver to an SSB mode, and to provide a third tuning dial and an associated third rotary knob so that the receiver can be finely tuned with an accuracy of about 100 Hz. This, of course, requires still another display device, but graduated in units of about 100 Hz. Thus, if an SSB transmission is to be received, operation of the change-over switch and the three rotary knobs make control of the receiver somewhat troublesome.

OBJECTS AND SUMMARY OF THE INVENTION

Accordingly, it is an object of this invention to provide a double superheterodyne receiver which is substantially free of the drawbacks encountered in prior art double superheterodyne receivers.

It is another object of this invention to provide a double superheterodyne receiver capable of being accurately tuned to any one of a wide band of frequencies by a single tuning operation.

It is a further object of this invention to provide a double superheterodyne receiver which can be constructed as a compact unit.

It is a more specific object of this invention to provide such a double superheterodyne receiver in which the need for dial indicators corresponding to first and second local oscillator frequencies is eliminated.

According to an aspect of this invention, a double superheterodyne receiver has a front-end stage for receiving an RF signal, a first local oscillator for generating a first local oscillator signal, a first mixer for mixing the RF signal with the first local oscillator signal to produce a first IF signal, a second local oscillator for generating a second local oscillator signal, a second mixer for mixing the first IF signal with the second local oscillator signal to produce a second IF signal, a detector for detecting information carried on the second IF signal, and control circuitry for controlling the frequencies of the first and second local oscillator signals. The first and second local oscillators each include a phase-locked loop circuit to which respective reference signals are provided and are each formed of a voltage controlled oscillator for providing the respective local oscillator signal at a frequency that varies with an error signal applied thereto, a phase comparator providing the error signal as a function of the relative phase of the local oscillator signal and the reference signal, and a programmable frequency divider coupled to divide the frequency of one of the local oscillator signal and the reference signal by a respective one of integral dividing ratios $N_1$ and $N_2$. The control circuitry, which can include a micro computer, together with associated peripheral devices such as a RAM and a ROM, selects the first and second dividing ratios $N_1$ and $N_2$ so that the first and second local oscillator circuits together act to tune the receiver to the frequency of a desired RF signal. The receiver of this invention is favorably arranged so that a unit change in the first dividing ratio $N_1$ corresponds to a change of 100 KHz in the received RF frequency, and a unit change in the second dividing ratio $N_2$ corresponds to a change of 1 KHz in the received RF frequency.

In order to facilitate reception of SSB transmissions, the second phase-locked loop local oscillator can include a frequency converter and a reference oscillator providing an adjustable frequency-convertng signal thereto. In such case, the reference oscillator can be selectively switchable between an AM mode, in which the frequency-converting signal remains at a constant preset frequency, and an SSB mode, in which the frequency-converting signal is tunable over a range of, for example, 1000 Hz.

The above and other objects, features, and advantages of the present invention will become apparent from the following description when considered in connection with the accompanying drawings.

BRIEF DESCRIPTION OF THE DRAWINGS

FIG. 2 is a table of frequency-dividing ratios $N_1$ and $N_2$ corresponding to desired frequencies, and is useful in explaining the operation of the receiver of FIG. 1;

DETAILED DESCRIPTION OF A PREFERRED EMBODIMENT

Figure 1:
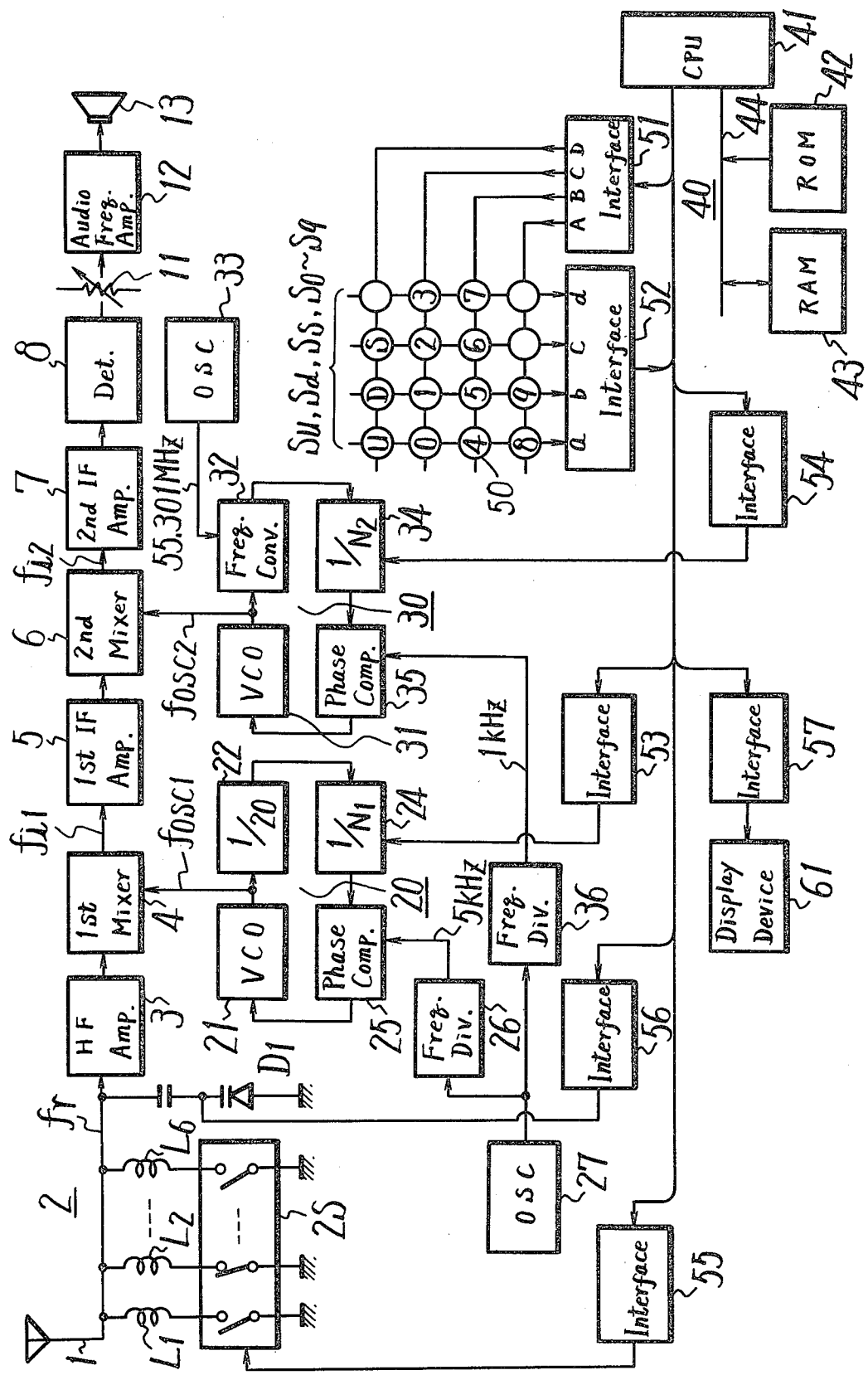
FIG. 1 is a circuit diagram of a double superheterodyne receiver embodying this invention.

With reference to the drawings, and initially to FIG. 1 thereof, a double superheterodyne receiver embodying this invention is illustrated in which a first local oscillating frequency is changeable at steps 100 KHz while a second local oscillating frequency is changeable at steps of 1 KHz, so that the reciver is tunable, at steps of 1 KHz, to frequencies in the range 100 KHz to 29.999 MHz.

As illustrated in FIG. 1, a received RF signal is conducted from an antenna 1 to a preselector stage 2 for pretuning the receiver to the frequency $f_r$ of a desired RF signal. The preselector stage 2 includes tuning coils $L_1$–$L_6$ and a preselector switch 2S. The latter switch 2S selectively connects one of the coils $L_1$–$L_6$, and the coil so selected is then coupled with a variable capacitance diode $D_1$, to form an LC wavetrap. A control signal provided to the switch 2S and a channel selection voltage applied to the diode $D_1$ causes the coil and the diode $D_1$ to tune approximately to the desired frequency $f_r$.

As will be described in detail later, the tuned frequency of the receiver is made to coincide with the desired RF frequency $f_r$ by varying the first and second local oscillating frequencies. The frequency $f_r$ can be expressed $$f_r = (N_1 \times 100) - (N_2 \times 1) - 66001$$

wherein $N_1$ is an integer in the range from 665 to 963, $N_2$ is an integer in the range from 300 to 399, and $f_r$ is expressd in KHz.

The preselector circuit 2 provides a band of received frequencies, including the frequency $f_r$, to a high-frequency amplifier 3 and thence to a first mixer 4. At the same time, a first phase-locked loop (PLL) local oscillator circuit 20 provides to the mixer 4 a first local oscillating signal having a frequency $f_{osc1}$, which is mixed with the received RF signal to provide a first intermediate frequency (IF) signal having a center frequency $f_{i1}$. The first local oscillator frequency $f_{osc1}$ can be expressed $$f_{osc1} = N_1 \times 100 \text{ KHz}$$

so that the IF signal center frequency $f_{il}$ can be expressed $$f_{i1} = f_{osc1} - f_r = N_2 \times 1 + 66001 \text{ KHz}.$$

The first IF signal is then applied through a first IF amplifier 5. This element acts as a band-pass filter that has a center frequency of 66.35 MHz and passes a band of frequencies 50 KHz above and below that center frequency.

The amplified and filtered first IF signal is provided thence to a second mixer 6. A second phase-locked loop (PLL) local oscillator circuit 30 produces a second local oscillating signal having a frequency $f_{osc2}$, which can be expressed $$f_{osc2} = (N_2 \times 1) + 55301 \text{ KHz}.$$

This second local oscillator signal is mixed in the mixer 6 with the first IF signal to provide a second IF signal having a center, or carrier frequency $f_{i2}$, which can be expressed $$f_{i2} = f_{i1} - f_{osc2} = 10.7 \text{ MHz}.$$

The second IF signal is supplied from the second mixer 6 to a second IF amplifier 7, and thence to an AM detector 8 to provide an audio signal. The audio signal from the detector 8 is controlled in volume by a variable resistor 11, and is furnished to an audio frequency amplifier 12 to drive an acoustic transducer 13, such as a loudspeaker or headphone set.

As is apparent from the above relationships, a variation in the integer $N_1$ by a step of "1" causes the tuned RF frequency $f_r$ to change by a corresponding step of 100 KHz, while a variation in the integer $N_2$ by a step of "1" causes the tuned frequency $f_r$ to change by a step of 1 KHz. The above-mentioned ranges of variation of $N_1$ and $N_2$ permit the receiver to be tuned, at 1 KHz steps, anywhere within a receiving band of 100 KHz to 29.999 MHz.

In this embodiment, these integers $N_1$ and $N_2$ are the frequency dividing ratios of programmable frequency dividers in the respective first and second PLL local oscillator circuits, which respectively synthesize the first and second local oscillator signals.

The first PLL local oscillator circuit 20 includes a voltage controlled oscillator (VCO) 21 providing the first local oscillator signal at a frequency that varies with a first error signal applied thereto. The first local oscillator signal is also applied to a 1/20 divider 22, whose output is coupled to a programmable divider 24. The latter provides a divided-down signal to one input of a phase comparator 25, which generates the error signal by comparison of the phase of the divided-down signal with the phase of a reference signal provided from a frequency divider 26. A reference oscillator 27 provides an oscillating signal to the frequency divider 26 so that the latter provides the reference signal at a frequency of 5 KHz.

Similarly, the second PLL local oscillator circuit 30 includes a VCO 31 providing the second local oscillator signal at a frequency that varies with an error signal applied to it. The second local oscillator signal is also applied to a frequency converter 32. A reference signal having a frequency of 55.301 MHz is applied from a reference oscillator 33 to the frequency converter 32 and a beat frequency is provided therefrom to a second programmable divider 34. The divided-down output of the second programmable divider 34 is applied to a phase comparator 35 to be compared in phase with a 1 KHz signal provided from a frequency divider 36 coupled to reference oscillator 27. The phase comparator 35 then provides the error signal to the VCO 31 to control the frequency of the second local oscillator signal.

It should be noted that because a 5 KHz reference signal is provided to the phase comparator 25, the frequency of the first local oscillator signal is expressed as follows $$f_{osc1} = 20 \times N_1 \times 5 \text{ KHz} = N_1 \times 100 \text{ KHz}.$$

Similarly, in the second PLL local oscillator circuit 30, the application of a 55.301 MHz reference signal to the frequency converter 32 and of a 1 KHz reference signal to the phase comparator 35 causes the second local oscillator signal to be provided at a frequency $f_{osc2}$ which can be expressed $$f_{osc2} = 55301 + N_2 \times 1 = (N_2 \times 1) + 55301 \text{ KHz}.$$

In this embodiment o the double superheterodyne receiver of this invention, the frequency dividing ratios $N_1$ and $N_2$ of the respective first and second programmable frequency dividers 25 and 34 are controlled by a micro computer 40. In this micro computer, a central processing unit (CPU) 41 performs the necessary control, computational, and signaling functions. A read-only memory (ROM) 42 stores an operational program for selecting the frequency dividing ratios $N_1$ and $N_2$, and a random access memory (RAM) 43 provides working memory for computations performed by the CPU 41. The ROM 42 and the RAM 43 are connected to the CPU 41 by means of a data bus 44. Various interfaces 51-57 are respectively connected to various associated data ports of the CPU 41.

A key switch panel 50 includes various key switches $S_u$, $S_d$, $S_s$, and $S_0$-$S_9$. These switches are connected in matrix form and are supplied with dynamic scanning pulses from the CPU 41 through the interface 51. The outputs of these key switches are then returned to the CPU 41 through the interface 52.

In the key switch panel 50, the key switch $S_u$ is an up-mode switch for selecting an up-mode in which the tuning frequency or the received RF signal is continuously increased at a constant speed so long as the key switch $s_u$ is depressed. Similarly, the key switch $S_d$ is a down-mode switch for selecting a down mode in which the tuning frequency is continuously lowered at a constant speed so long as the key switch $S_d$ is depressed.

The key switches $S_0$-$S_9$ are used to establish the tuning of the received RF frequency $f_r$. For example, if the switches $S_1$, $S_0$, and $S_s$ are successively depressed, the received RF frequency $f_r$ is set at 10 MHz. Other key switches can be included in the switch panel 50 to initiate other functions.

The CPU 41 of the micro computer 40 provides selecting signals to the interfaces 53 and 54, which respectively determine the frequency dividing ratios $N_1$ and $N_2$ of the first and second programmable dividers 24 and 34.

The CPU 41 also provides a signal to the interface 55 which in turn provides a control signal to actuate the preselector switch circuit 2S. At the same time, a channel selection code is provided from the CPU 41 to the interface 56 which converts the code to analog form and applies the same as a preselect voltage to the variable capacitance diode $D_1$.

Finally, frequency data provided from the CPU 41 to the interface 57 is converted therein to display information, and is provided therefrom to a display device 61 or indicating the received frequency. The display device 61 can be, for example, an LCD or LED display matrix, and preferably is capable of displaying at least 5 significant digits. The display device 61 can also include indicia to indicate other parameters, such as signal strength and the like.

The CPU 41 and the interfaces 53 and 54, in conjunction with the ROM 42, provide the frequency dividing ratios $N_1$ and $N_2$ as a function of the desired radio frequency $f_r$ according to the relationship illustrated in the table of FIG. 2. That is, if the received RF frequency $f_r$ is to be increased in steps of 1 KHz, the dividing ratio $N_2$ decrements stepwise from 399 to 300 while the dividing ratio $N_1$ is held constant. Then, when the dividing ratio $N_2$ reaches the value 300, and the received frequency is to be further increased by 1 KHz, the dividing ratio $N_2$ recurs or circulates from 300 back to 399, and the value of the dividing ratio $N_1$ increases by unity. This operation can be compared with an inverse carry function in which a first decimal counter is incremented whenever a second decimal counter is decremented from 00 to 99.

If the received frequency $f_r$ is decreased in unit steps of 1 KHz, an inverse operation is carried out so that whenever the dividing ratio $N_2$ is 399 and the received frequency $f_r$ is to be decreased by a unit step of 1 KHz, the dividing ratio $N_2$ circulates from 399 to 300 and the dividing ratio $N_1$ decreases by unity.

In this fashion, the received frequency $f_r$ is changeable at discrete steps of 1 KHz within a frequency band of 100 KHz to 299.999 MHz in response to the selection by the micro computer 40 of the frequency dividing ratios $N_1$ and $N_2$. However, because these frequency dividing ratios $N_1$ and $N_2$ are selected according to the scheme shown in the table of FIG. 2, the received frequency $f_r$ can be changed substantially continuously, the channel selection can be easily and accurately carried out.

Of course, because the relationship of the dividing ratios $N_1$ and $N_2$ is regular and cyclic, FIG. 2 only shows a portion of the entire table. Nevertheless, it would not be difficult for a person skilled in the art to produce the entire table, or to determine values of the frequency dividing ratios $N_1$ and $N_2$ to correspond to a desired frequency $f_r$.

Also, while this embodiment utilizes a micro computer 40 to calculate the values of the dividing ratios $N_1$ and $N_2$, a hard-wired logic circuit could also be used for this purpose.

Figure 3:
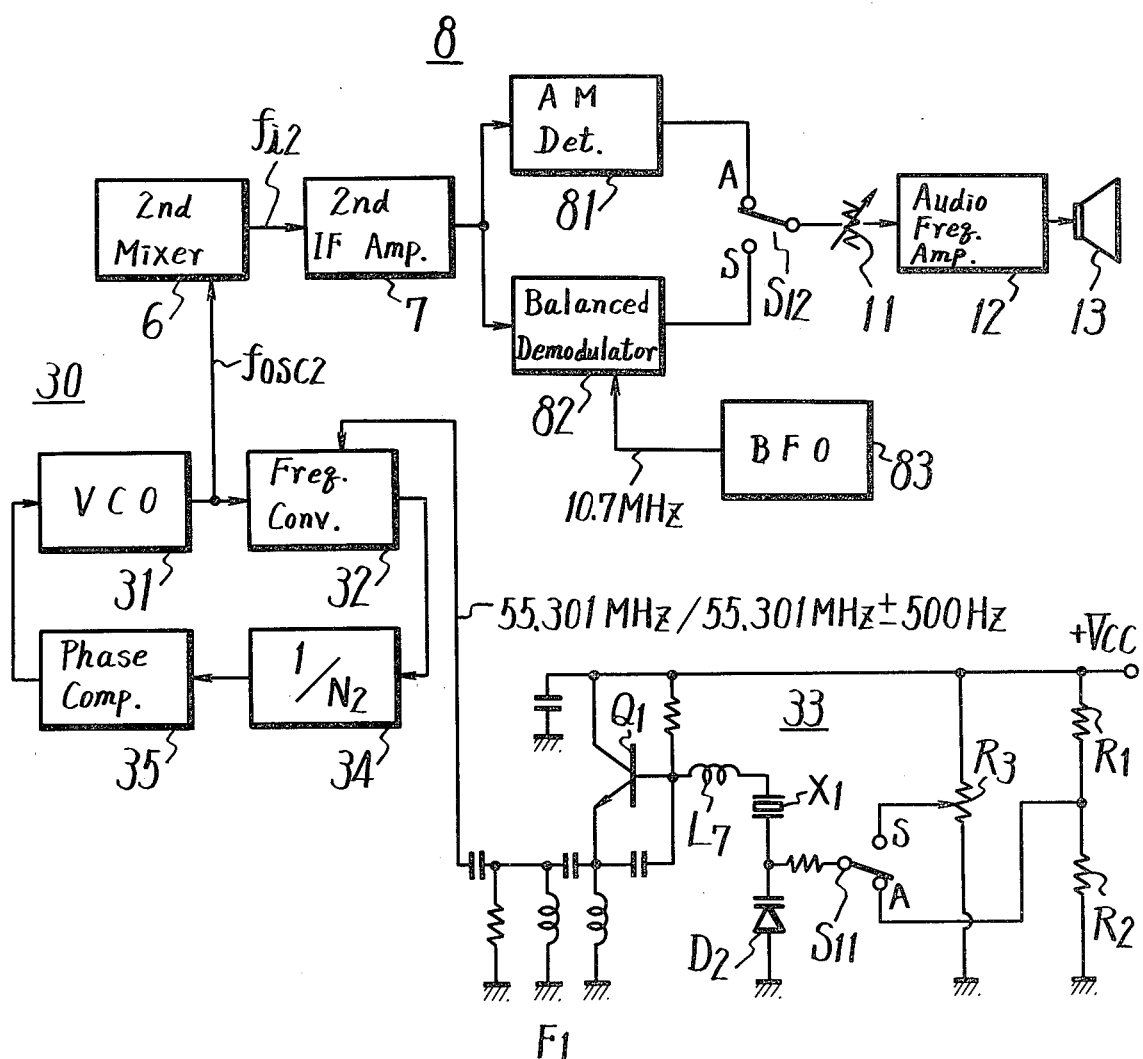
FIG. 3 is a circuit diagram showing pertinent parts of one variation of the receiver illustrated in FIG. 1.

FIG. 3 illustrates one variation of the receiver according to this invention. Elements in FIG. 3 which are identical with those shown in FIG. 1 are identified with the same reference numerals, and a detailed description thereof is omitted. Also, for the sake of simplicity, those stages in advance of the second mixer 6 are omitted in the illustration of FIG. 3.

The radio receiver illustrated in FIG. 3 is especially adapted for selectively receiving both SSB transmissions and AM transmissions.

In the embodiment illustrated in FIG. 1, the received frequency $f_r$ can be changed at steps of 1 KHz. However, when receiving an SSB transmission, optimum tuning cannot be achieved unless the receiver can be tuned to the frequency $f_r$ with an accuracy of about 100 Hz. To achieve such accuracy, a ratio receiver constructed substantially as illustrated in FIG. 3 permits the received RF frequency $f_r$ to be changed continuously within a range of 1 KHz. This range is substantially the same magnitude as the unit frequency change corresponding to a unit change in the second dividing ratio $N_2$. Thus, a receiver constructed as shown in FIG. 3 permits stable reception of SSB signals.

In the receiver of FIG. 3, reference oscillator 33 is constructed as an overtone or harmonic type oscillator, with a crystal resonator $X_1$ coupled through a temperature compensating coil $L_7$ to the base of a driven transistor $Q_1$. A source voltage $V_{cc}$ is applied to the collector of the transistor $Q_1$ while the emitter thereof is coupled through a band-pass filter $F_1$ to the frequency converter 32. A variable capacitance diode $D_2$ is also coupled to the crystal resonator $X_1$ to effect small changes in its resonant frequency. A mode switch $S_{11}$ has a movable contact coupled to the variable capacitance diode $D_2$, and AM fixed contact A coupled to the junction of a pair of fixed resistors $R_1$ and $R_2$ connected in series between the source voltage $V_{cc}$ and ground, and an SSB fixed contact S coupled to the slider of a variable resistance $R_3$ connected between the source voltage $V_{cc}$ and ground.

In the receiver of FIG. 3, detecting circuit 8 includes an AM detector 81 and a balanced demodulator 82, each of which receives the second IF signal from the second IF amplifier 7. A mode selector switch $S_{12}$ has an AM fixed contact A coupled to the output of the AM detector 81, and SSB fixed contact S coupled to the output of the balanced demodulator 82, and a movable contact coupled through the volume control 11 to the audio amplifier 12. A beat-frequency oscillator (BFO) 82 provides a 10.7 MHz beat-frequency signal to the balanced demodulator 82.

It it is desired to listen to an AM transmission, the movable contacts of the mode switches $S_{11}$ and $S_{12}$ are turned to their respective AM contacts A. The fixed voltage provided from the junction of the resistors $R_1$ and $R_2$ to the variable capacitance diode $D_2$ maintains the frequency of the frequency converting signal at 55.301 MHz. In this way, the second PLL local oscillator circuit 30 provides the second local oscillator signal at a constant frequency $f_{osc2}$, and the center frequency $f_{i2}$ of the second IF signal supplied to the AM detector 81 is a constant 10.7 MHz.

On the other hand, if it is desired to listen to an SSB transmission, the movable contacts of the mode switches $S_{11}$ and $S_{12}$ are turned to their respective contact S. Thus, in the SSB mode, a variable voltage, determined by the position of the slider of the variable resistor $R_3$, is applied to the variable capacitance diode $D_2$. The frequency of the frequency converting signal is thus tunable from approximately 500 Hz below the frequency 55.301 MHz to approximately 500 Hz above that frequency. In other words, in the SSB mode, the frequency $f_{osc2}$ of the second local oscillating signal is continuously tunable over a range of 1000 Hz by adjusting the setting of the slider of the variable resistor $R_3$.

Also at this time, the second IF signal is applied to the balanced demodulator 82 to which the beat-frequency signal from BFO 83 is also applied. A demodulated SSB signal is then provided therefrom through the mode switch $S_{12}$ and the volume control 11 to the audio amplifier 12.

Because the frequency $f_{osc2}$ of the second local oscillator signal is continuously tunable within a range of approximately 1000 Hz, the carrier center frequency $f_{i2}$ of the second IF signal can be properly offset from the frequency of the beat-frequency signal for receiving either an upper-side band (USB) or a lower-side band (LSB) transmission. In addition, this frequency difference can be adjusted to achieve peak audio tone when listening to CW or code transmissions.

Then, when the mode selection switches $S_{11}$ and $S_{12}$ are returned to their AM contacts A, the same fixed voltage is applied to the variable capacitance diode $D_2$ regardless of the setting of the variable resistor $R_3$. Therefore, precise tuning is always achieved in the AM mode.

It is apparent that even though the received frequency $f_r$ is tuned stepwise at discrete steps of 1 KHz, the arrangement of reference oscillator 33 as shown in FIG. 3 permits the received frequency $f_r$ to be continuously turned throughout the entire receiving range of 100 KHz to 29.999 MHz.

Thus, the tuning frequency $f_r$ can be precisely adjusted until an optimum tuning point is reached for receiving an SSB transmission.

Furthermore, in the receiver of this invention, the frequency difference between the frequency of the beat-frequency signal and the center frequency $f_{i2}$ of the second IF signal is adjusted in the second PLL local oscillator circuit rather than in an additional stage. This construction keeps the total number of stages at a minimum, thereby simplifying the construction of the receiver and enhancing its reliability.

If the display device 61 is capable only of displaying the received frequency $f_r$ in steps of 1 KHz, the changes in frequency attributable to the adjustment of the variable resistor $R_3$ can be provided directly, for example, from graduations on a knob attached to the slider of the variable resistor $R_3$. Alternatively, the frequency attributable to the adjustment of the resistor $R_3$ can be displayed digitally. For example, if, rather than a simple variable resistor, the resistor $R_3$ is a digitally controlled device providing an adjustable voltage to the variable capacitance diode $D_2$, the micro computer 40 could be used to control the tuning of the reference oscillator 33. The continuous tuning of the reference oscillator 33 could then be controlled by depressing the key switches on the key switch panel 50, and the precise frequency could be displayed on the display device 61.

While certain embodiments of this invention are illustrated hereabove, it is apparent that many variations and modifications can be effected thereto without departing from the spirit and scope of this inention, which are to be ascertained from the appended claims.

What is claimed is:

1. A double superheterodyne receiver having a front-end stage for receiving an RF signal, first local oscillator means for generating a first local oscillator signal, first mixer means for mixing the RF signal with the first local oscillator signal to produce a first IF signal, second local oscillator means for generating a second local oscillator signal, second mixer means for mixing the first IF signal with the second local oscillator signal to produce a second IF signal, detecting means for detecting information carried on the second IF signal, and control means for controlling the frequencies of the first and second local oscillator signals; wherein said first local oscillator means includes a first phase-locked loop circuit formed of means providing a first reference signal, a first voltage controlled oscillator providing said first local oscillator signal at a frequency that varies with a first error signal applied thereto, first phase comparator means providing said first error signal as a function of the relative phase of the first local oscillator signal and said first reference signal, and first programmable frequency divider means coupled to said first voltage controlled oscillator to divide the frequency of said first local oscillator signal by a first integer $N_1$ before application to said first phase comparator means; wherein said second local oscillator means includes a second phase-locked loop circuit formed of means providing a second reference signal, a second voltage controlled oscillator providing said second local oscillator, signal at a frequency that varies with an error signal applied thereto, second phase comparator means providing said second error signal as a function of the relative phase of said second local oscillator signal and said second reference signal, and second programmable frequency divider means coupled to divide the frequency of said second local oscillator signal by a second integer $N_2$ before application to said second phase comparator means; and wherein said control means selects the first integer $N_1$ and the second integer $N_2$ so that the first and second local oscillator means are tuned to respective local oscillator frequencies together corresponding to the frequency of a desired RF signal, said control means including frequency selection means for selecting the frequency of the desired RF signal and automatic control circuit means interfaced with said frequency selection means for providing the integers $N_1$ and $N_2$ in response to said selecting, wherein a unit change in said first integer $N_1$ corresponds to a change of a predetermined amount in the received RF frequency and a unit change in said second integer $N_2$ corresponds to a change of a smaller predetermined amount in the received RF frequency; with said second integer $N_2$ being provided within a predetermined range of integers; and with the automatic control circuit means providing said second integer $N_2$ such that when the same is at an end of its predetermined range, said automatic control circuit means achieves a successive RF frequency change by automatically circulating said second integer $N_2$ to the other end of its predetermined range and simultaneously changing said first integer $N_1$ by a unit increment.

2. A double superheterodyne receiver according to claim 1, wherein a unit change in said first integer $N_1$ corresponds to a change of 100 KHz in the received RF frequency, and a unit change in said second integer $N_2$ corresponds to a change of 1 KHz in the received RF frequency.

3. A double superheterodyne receiver according to claim 1, wherein the received RF frequency $f_r$ is substantially determined according to the following formula $$f_r = (N_1 \times 100 \text{ KHz}) - (N_2 \times 1 \text{ KHz}) - f_o$$

where $f_o$ is a predetermined constant frequency.

4. A double superheterodyne receiver according to claim 3, wherein $f_o$ is substantially 66001 KHz, the first integer $N_1$ is selected from integers in the range 665 to 963, and the second integer $N_2$ is selected from integers in the range 300 to 399.

5. A double superheterodyne receiving according to claim 1, wherein said control means includes microcomputer means for computing the integers $N_1$ and $N_2$.

6. A double superheterodyne receiver according to claim 5, wherein said control means further includes storage means providing said first and second integers $N_1$ and $N_2$ in response to selection of a desired RF frequency.

7. A double superheterodyne receiver having a front-end stage for receiving an RF signal, first local oscillator means for generating a first local oscillator signal, first mixer means for mixing the RF signal with the first local oscillator signal to produce a first IF signal, second local oscillator means for generating a second local oscillator signal, second mixer means for mixing the first IF signal with the second local oscillator signal to produce a second IF signal, detecting means for detecting information carried on the second IF signal, and control means for controlling the frequencies of the first and second local oscillator signals; wherein said first local oscillator means includes a first phase-locked loop circuit formed of means providing a first reference signal, a first voltage controlled oscillator providing said first local oscillator signal at a frequency that varies with a first error signal applied thereto, first phase comparator means providing said first error signal as a function of the relative phase of the first local oscillator signal and said first reference signal, and first programmable frequency divider means coupled to divide the frequency of said first local oscillator signal by a first integer $N_1$ before application to said first phase comparator means; wherein said second local oscillator means includes a second phase-locked loop circuit formed of means providing a second reference signal, a second voltage controlled oscillator providing said second local oscillator signal at a frequency that varies with an error signal applied thereto, second phase comparator means providing said second error signal as a function of the relative phase of said second local oscillator signal and said second reference signal, and second programmable frequency divider means coupled to divide the frequency of said second local oscillator signal by a second integer $N_2$, a frequency converter interposed between said second voltage controlled oscillator and said second programmable divider means, and a reference oscillator circuit providing a frequency converting signal to said frequency converter means to convert thereby the frequency of said second local oscillator signal; wherein said reference oscillator circuit includes means selectively switchable between a first mode in which said frequency converting signal is provided at a fixed preset frequency and a second mode in which said frequency converting signal is tunable over a range corresponding to a unit change in said second integer $N_2$; and wherein said control means selects the first integer $N_1$ and the second integer $N_2$ so that the first and second local oscillator means are tuned to respective local oscillator frequencies together corresponding to the frequency of a desired RF signal.

8. A double superheterodyne receiver according to claim 7, wherein said reference oscillator includes a crystal resonator, a voltage controlled capacitor coupled thereto, a fixed voltage source, a selectively variable voltage source, and a mode switch selectively coupling one of said fixed voltage source and said variable voltage source to said voltage controlled capacitor.

9. A double superheterodyne receiver having a front-end stage for receiving an RF signal, first local oscillator means for generating a first local oscillator signal, first mixer means for mixing the RF signal with the first local oscillator signal to produce a first IF signal, second local oscillator means for generating a second local oscillator signal, second mixer means for mixing the first IF signal with the second local oscillator signal to produce a second IF signal, detecting means for detecting information carried on the second IF signal, and control means for controlling the frequencies of the first and second local oscillator signals; wherein said front-end stage includes a plurality of tuning coils, a tuning capacitor, and switching means for selectively coupling one of said tuning coils to said tuning capacitor in response to a selection of first and second tuning integers $N_1$ and $N_2$; wherein said first local oscillator means includes a first phase-locked loop circuit formed of means providing a first reference signal, a first voltage controlled oscillator providing said first local oscillator signal at a frequency that varies with a first error signal applied thereto, first phase comparator means providing said first error signal as a function of the relative phase of the first local oscillator signal and said first reference signal, and first programmable frequency divider means coupled to divide the frequency of said first local oscillator signal by said first integer $N_1$ prior to application to said first phase comparator means; wherein said second local oscillator means includes a second phase-locked loop circuit formed of means providing a second reference signal, a second voltage controlled oscillator providing said second local oscillator signal at a frequency that varies with an error signal applied thereto, second phase comparator measn providing said second error signal as a function of the relative phase of said second local oscillator signal and said second reference signal, and second programmable frequency divider means coupled to divide the frequency of said second local oscillator signal by said second integer $N_2$ prior to application to said second phase comparator means; and wherein said control means selects the first integer $N_1$ and the second integer $N_2$ so that the first and second local oscillator means are tuned to respective local oscillator frequencies together corresponding to the frequency of a desired RF signal.

10. A double superheterodyne receiver according to claim 9, wherein said tuning capacitor includes a variable capacitance diode, and said control means includes means providing to said variable capacitance diode a tuning voltage whose value is a function of the first and second integers $N_1$ and $N_2$.

11. In a double superheterodyne receiver of the type comprising means for receiving an incoming RF signal, first local oscillator means providing a first local oscillator signal at a first local oscillator frequency, first mixer means for mixing said incoming RF signal with said first local oscillator signal to obtain a first IF signal, second local oscillator means providing a second local oscillator signal at a second local oscillator frequency, second mixer means for mixing said first IF signal with said second local oscillator signal to obtain a second IF signal, detecting means for detecting information carried on said second IF signal, and control means for controlling the respective frequencies of said first and said second local oscillator signals; wherein said first and second local oscillator means each include digitally controlled frequency generator means for providing said first and second local oscillator signals at frequencies that are substantially linear functions of first and second digital values $N_1$ and $N_2$, respectively; and wherein said control means includes automatic logic circuitry for providing said digital values $N_1$ and $N_2$ to the respective digitally controlled frequency generators of said first and second local oscillator means as a function of selecting a desired frequency of said incoming signal, with the second digital value $N_2$ being provided from a perdetermined range of integers so that the second local oscillator frequency remains in a corresponding range of frequencies, with a unit change in the first digital value $N_1$ corresponding to a frequency change equal to said corresponding range of frequencies; the improvement wherein said control means includes frequency selection means interfaced with said logic circuitry for selecting said desired frequency, with said logic circuitry providing said second digital value $N_2$ such that when the latter is at an end of its predetermined range, said logic circuitry carries out a successive RF frequency change by automatically circulating said second digital value $N_2$ to the other end of its predetermined range and simultaneously changing said first digital value $N_1$ by a unit increment.

12. The double superheterodyne receiver of claim 11, wherein the receiver further comprises band pass filter means for limiting said first IF signal to a bandwidth substantially the same as the range of said second local oscillator frequency.

13. The double superheterodyne receiver of claim 11, wherein the logic circuitry of said control means includes micro computer means coupled to said first and second local oscillator means for providing said digital values $N_1$ and $N_2$ in response to a selection of a desired RF tuning frequency, and said frequency selection means includes a plurality of key switches coupled to said logic circuitry and on which said desired RF tuning frequency can be selected.

* * * * *